(12) United States Patent
Toratani et al.

(10) Patent No.: US 9,087,910 B2
(45) Date of Patent: Jul. 21, 2015

(54) SEMICONDUCTOR DEVICE AND MANUFACTURING METHOD OF THE SAME

(71) Applicant: KABUSHIKI KAISHA TOSHIBA, Tokyo (JP)

(72) Inventors: Kenichiro Toratani, Kanagawa (JP); Masayuki Tanaka, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/016,958

(22) Filed: Sep. 3, 2013

(65) Prior Publication Data

US 2014/0061769 A1 Mar. 6, 2014

(30) Foreign Application Priority Data

Sep. 6, 2012 (JP) ................................. 2012-196428

(51) Int. Cl.
*H01L 29/792* (2006.01)
*H01L 29/51* (2006.01)
*H01L 29/423* (2006.01)
(Continued)

(52) U.S. Cl.
CPC ........ *H01L 29/792* (2013.01); *H01L 21/28273* (2013.01); *H01L 21/28282* (2013.01); *H01L 27/11521* (2013.01); *H01L 27/11568* (2013.01); *H01L 29/4234* (2013.01); *H01L 29/42332* (2013.01); *H01L 29/518* (2013.01);
(Continued)

(58) Field of Classification Search
CPC .............. H01L 29/51; H01L 21/28273; H01L 21/28282; H01L 27/11521; H01L 27/11568; H01L 29/42332; H01L 29/4234; H01L 29/518; H01L 29/66825; H01L 29/66833; H01L 29/7881; H01L 29/792
USPC .................................................. 257/314–324
See application file for complete search history.

(56) References Cited

U.S. PATENT DOCUMENTS

2007/0215929 A1* 9/2007 Yasuda ......................... 257/314
2008/0014745 A1 1/2008 Fujitsuka et al.
(Continued)

FOREIGN PATENT DOCUMENTS

JP 2007-287859 11/2007
JP 2008-124144 5/2008
(Continued)

OTHER PUBLICATIONS

Office Action mailed Feb. 24, 2015, filed in corresponding Japanese Patent Application No. 2012-196428, with English translation.

*Primary Examiner* — Thanh T Nguyen
(74) *Attorney, Agent, or Firm* — Patterson & Sheridan, LLP

(57) ABSTRACT

According to one embodiment, a nonvolatile semiconductor storage device includes a semiconductor substrate, a first insulating film formed on the semiconductor substrate, a charge accumulation film formed on the first insulating film, a second insulating film formed on the charge accumulation film, and a control electrode formed on a second insulating film, and one of the first and the second insulating film includes a layer containing nitrogen, a layer that is formed on the layer containing nitrogen and that includes a first oxygen containing aluminum atoms and oxygen atoms, and a layer that is formed on the layer including the first oxygen and that includes a second oxygen containing silicon atoms and oxygen atoms; and a concentration of the aluminum atoms is from 1E12 atoms/cm$^2$ to 1E16 atoms/cm$^2$.

12 Claims, 10 Drawing Sheets

(51) Int. Cl.
*H01L 29/66* (2006.01)
*H01L 29/788* (2006.01)
*H01L 21/28* (2006.01)
*H01L 27/115* (2006.01)

(52) U.S. Cl.
CPC .... *H01L29/66825* (2013.01); *H01L 29/66833* (2013.01); *H01L 29/7881* (2013.01)

(56) References Cited

U.S. PATENT DOCUMENTS

| | | |
|---|---|---|
| 2008/0296656 A1 | 12/2008 | Ozawa |
| 2009/0189213 A1 | 7/2009 | Matsuo et al. |
| 2009/0267134 A1 | 10/2009 | Koike et al. |
| 2010/0052035 A1 | 3/2010 | Koike et al. |
| 2011/0122698 A1 | 5/2011 | Izumida et al. |

FOREIGN PATENT DOCUMENTS

| | | |
|---|---|---|
| JP | 2009-170781 A | 7/2009 |
| JP | 2009170719 | 7/2009 |
| JP | 2009-231373 A | 10/2009 |
| JP | 2009-283827 | 12/2009 |
| JP | 2010-021186 A | 1/2010 |
| JP | 2010-022186 | 1/2010 |
| JP | 2010-027967 A | 2/2010 |
| JP | 2010-034233 A | 2/2010 |
| JP | 2010-062387 A | 3/2010 |
| JP | 2011-114034 A | 6/2011 |
| JP | 2011-155266 A | 8/2011 |
| WO | 2011055433 | 5/2011 |

* cited by examiner

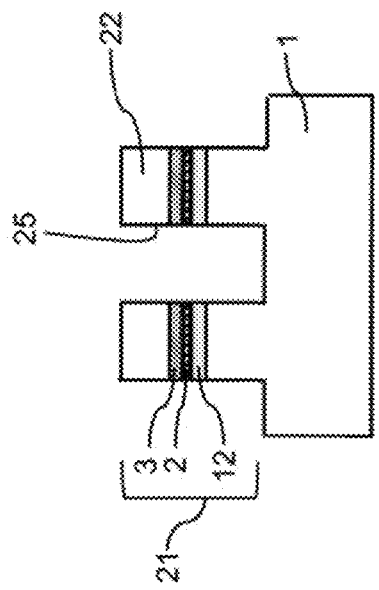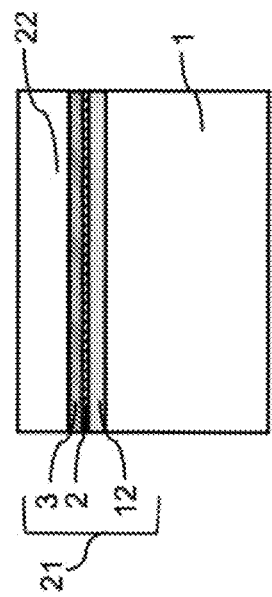

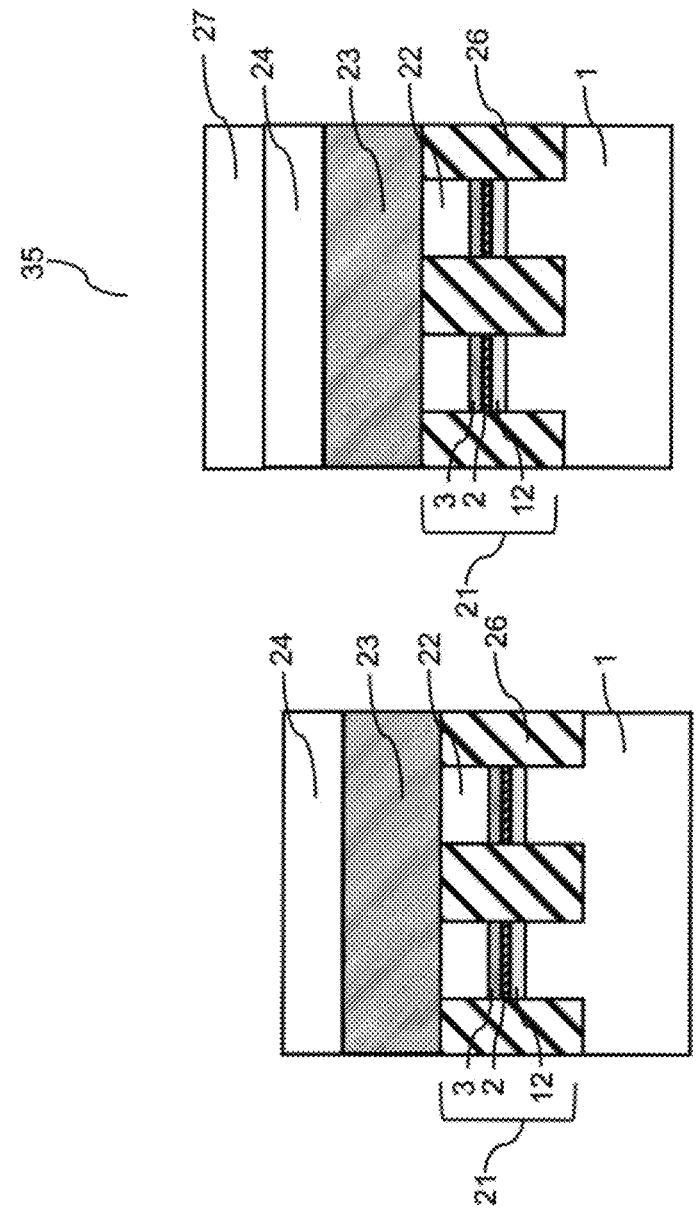

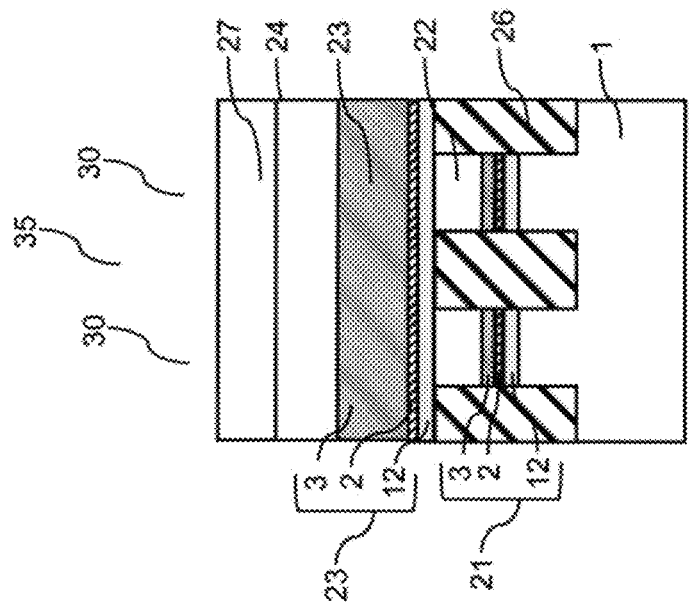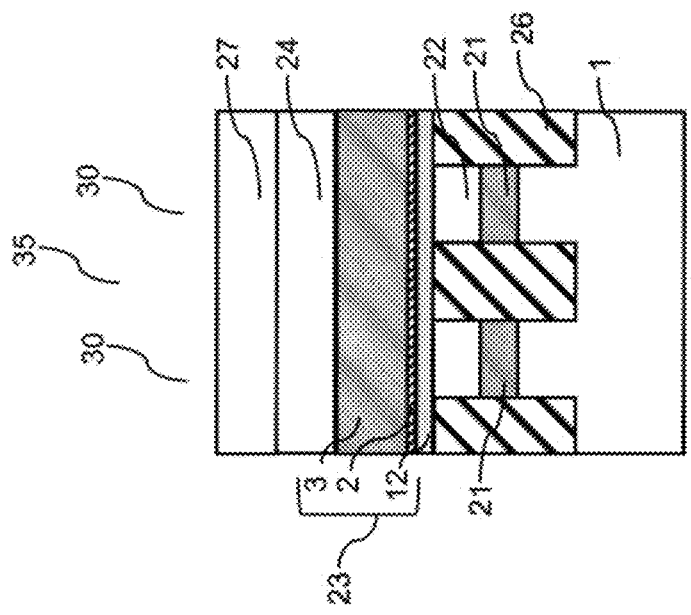

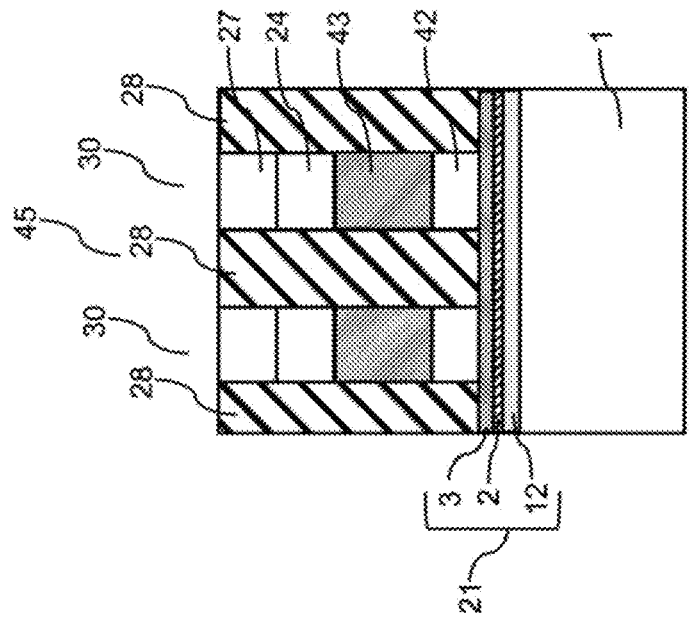
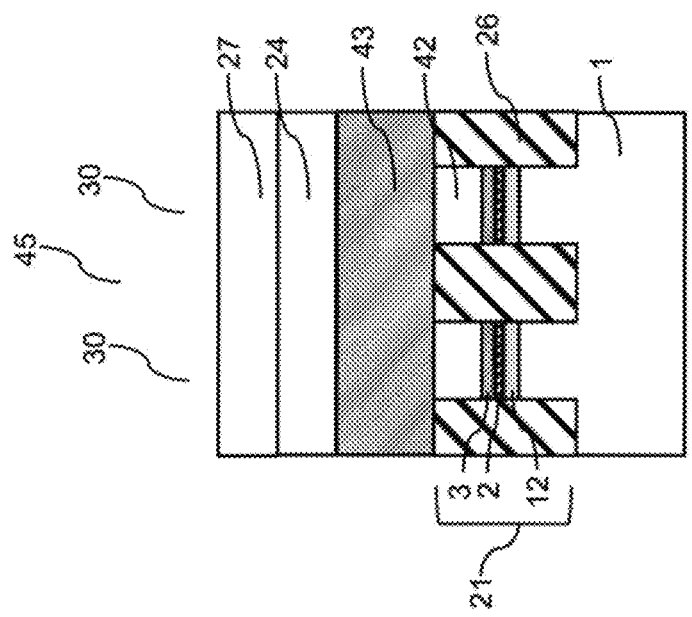

SEMICONDUCTOR DEVICE AND MANUFACTURING METHOD OF THE SAME

CROSS-REFERENCE TO RELATED APPLICATION

This application is based upon and claims the benefit of priority from Japanese Patent Application No. 2012-196428, filed Sep. 6, 2012, the entire contents of which are incorporated herein by reference.

FIELD

Embodiments described herein relate to a semiconductor device and a manufacturing method of the same.

BACKGROUND

In order to improve the characteristics of a MONOS (Metal Oxide Nitride Oxide Silicon) type of nonvolatile semiconductor storage device, which is a type of semiconductor device, for example, there is a demand for suppressing leaks from the charge accumulation film to the control gate electrode via the block insulating film at writing to the storage device. Also, for example, there is an important to suppress the injection of electrons from the control gate electrode to the charge accumulation film during erasing of the storage device. Furthermore, for example, there is an important to suppress the leakage of stored electrons from the charge accumulation film to the control gate electrode or the semiconductor substrate via the block insulating film or the tunnel insulating film during the charge retention period of the storage device.

These same properties are important for the FG (Floating Gate) type of nonvolatile semiconductor storage device.

Therefore, there is an important for a film that suppresses leakage, etc., in a tunnel insulating film and a block insulating film used in an MONOS type of nonvolatile semiconductor storage device, or in a tunnel insulating film and an interelectrode insulating film used in an FG-type nonvolatile semiconductor storage device, and furthermore in a tunnel insulating film, floating gate insulating film, and interelectrode insulating film, used in a double floating gate type nonvolatile semiconductor storage device that includes two layers of floating gate.

DESCRIPTION OF THE DRAWINGS

FIGS. 4A and 4B are diagrams (first) describing the manufacturing method for the semiconductor storage device according to a second embodiment.

FIGS. 5A and 5B are diagrams (second) describing the manufacturing method for the semiconductor storage device according to the second embodiment.

FIGS. 8A and 8B are cross-sectional diagrams (first) of an alternative example of the semiconductor storage device according to the second embodiment.

FIGS. 9A and 9B are cross-sectional diagrams (second) of an alternative example of the semiconductor storage device according to the second embodiment.

DETAILED DESCRIPTION

In general, according to one embodiment, the disclosure is described with reference to figures. However, the present disclosure is not limited to this embodiment. Additionally, parts and features of the embodiments that are common in all figures shall be given the same reference numbers and symbols and redundant descriptions will be omitted. Further, the drawings are schematic diagrams to describe the disclosure and to aid in its understanding, and there are parts where its shape, dimensions, and ratios, etc., differ from the actual device, but these may go through design changes accordingly, taking into account the descriptions below and common knowledge.

According to the embodiment of the present disclosure, the nonvolatile semiconductor storage device includes a semiconductor substrate, a first insulating film formed on the semiconductor substrate, a charge accumulation film formed on the first insulating film, a second insulating film formed on the charge accumulation film, and a control electrode formed on the second insulating film. Furthermore, one of the first insulating film and the second insulating film includes a layer containing nitrogen and a layer that is formed on the layer containing nitrogen and that includes a first oxygen containing aluminum atoms and oxygen atoms, and a layer that is formed on the layer including the first oxygen and that includes a second oxygen containing silicon atoms and oxygen atoms; and a concentration of the aluminum atoms is from $1E^{12}$ atoms/cm$^2$ to $1E^{16}$ atoms/cm$^2$.

First Embodiment

The manufacturing method for the semiconductor device 15 according to the present embodiment is described using FIGS. 1A to 1D. Here, a method wherein an insulating film 4 is formed on the semiconductor device 1 will be used as an example for the description, but the present disclosure is not limited to this and can be applied to various semiconductor devices and their parts.

Figure 1A:
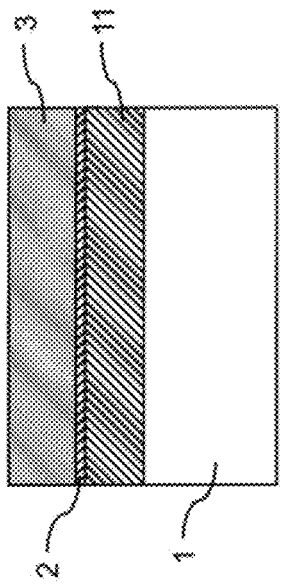
FIGS. 1A to 1D are diagrams describing the manufacturing method for the semiconductor device according to a first embodiment.

First, as shown in FIG. 1A, a semiconductor substrate 1 is provided. This semiconductor substrate 1 is not limited to a silicon substrate, and it can be another type of substrates (for example, SiGe substrates). Also, there can be various structural objects, etc., such as various films, steps, and semiconductor elements previously formed on its surface.

Figure 1B:
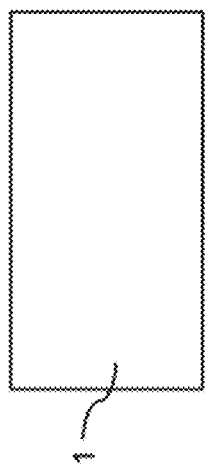

Next, atoms (first atom) such as aluminum, etc., are adsorbed on the upper surface of the semiconductor device 1 to form a first conductor compound. In detail, the adsorbed atoms may be, besides aluminum, atoms selected from non-transition metals such as boron, etc., beryllium, magnesium, calcium, strontium, barium, etc., and transition metals such as yttrium, lanthanum, cerium, titanium, zirconium, hafnium, tantalum, tungsten, etc. Furthermore, it is preferable that the atoms are adsorbed such that they have a concentration greater than or equal to $1E^{12}$ atoms/cm$^2$ and less than or equal to $1E^{16}$ atoms/cm$^2$. Furthermore, these atoms, due to their own properties or to the adsorption conditions, form a film of one of either an oxide film, nitride film, boride film, sulfide film, or carbide film, but in the present embodiment, it is not limited to formation of a film-like substance as long as the atoms are present on the surface of the semiconductor device 1. When the atoms form a film, the film thickness is around 1 atom thick and, for example, when the atoms form an aluminum oxide film, the film thickness will be around 0.001 nm to 1 nm. The descriptions below, as shown in FIG. 1B, will be provided as if an oxide film 2 is formed.

The adsorption of atoms can be carried out, for example, with an atomic layer deposition method (ALD method). In detail, in the case of forming an aluminum oxide film as the oxide film 2, trimethyaluminum (TMA) is used as the aluminum source and ozone is used as the oxidant, with this being done at a film-forming temperature of 400° C. This ALD method forms a film by repeating, multiple times, the sequence of supplying an active gas such as ozone, purging by vacuum emission, supplying metal containing ingredient gas such as TMA, purging by vacuum emission, and again supplying an active gas such as ozone. As for the forming method of the oxide layer 2 of the present embodiment, it is possible to use various materials and methods other than those mentioned. For example, as the source of aluminum, other alkyl aluminum atoms to which alkyl groups other than the methyl group have bonded with the aluminum element, or amino compounds wherein amino groups have bonded with the aluminum element, or material such as an aluminum halide, can be used. For the oxidant, ozone, water, oxygen, or oxygen radicals, nitrous oxide, etc., and other materials can be used. Also, regarding the film forming method, it is not limited to the ALD method, and methods such as the chemical vapor deposition (CVD) method, that which uses the physical excitation such as physical vapor deposition (PVD) method, application method, or an adsorption method wherein it is dipped in a solution in which the pertinent ions are dissolved can be used as well.

Also, this adsorption of atoms is preferably carried out in a temperature range of, for example, room temperature to around 500° C. The surface adsorption reaction of atoms is a competitive reaction involving the adsorption and desorption of atoms, and when the temperature is too high, the desorption of atoms becomes dominant, making it difficult to adsorb the desired concentration of atoms. In addition, problems can occur, such as the aluminum source being broken down or, due to the CVD reaction occurring, the uniformity of the adsorption amount within the surface can deteriorate. On the other hand, if the temperature is too low, for example, because the reaction of the oxidant with the aluminum source becomes weak, many organic groups will remain in the aluminum source. As a result, faults, etc., are formed in the resulting atomic matrix or the film, so there is the problem that, in the end, the desired film concentration cannot be obtained. Therefore, depending on the type, etc., of the aluminum source that is used, it is preferable to adjust the adsorption temperature.

In the case of using a nitride film instead of the oxide film 2, a nitriding agent should be introduced into the furnace instead of an oxidant. For the nitriding agent, ammonia, hydrazine, radical nitrogen, etc., that has been excited into radicals, can be used. Similarly, in the case of using a boride film, boron compounds such as diborane and boron chloride should be used as the boriding agent, and in the case of using a sulfide film, hydrogen sulfide, etc., should be used as the sulfiding agent. In the case of using carbide film, the film can be formed using a carbon source that comprises organic groups such as ethylene groups, etc.

Figure 1C:
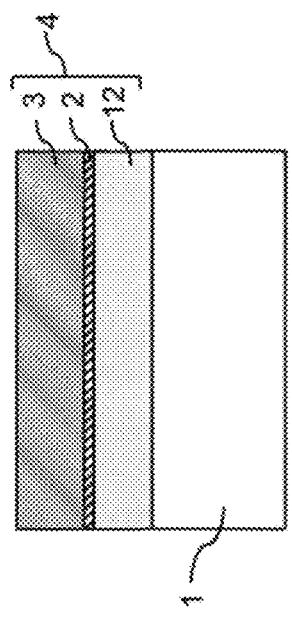

Next, as shown in FIG. 1C, an oxide film 3 is formed on the oxide film 2 as the underlying material including a silicon oxide film where the film thickness is 2 nm to 5 nm to form a second conductive compound. The oxide film 3 that is formed on the oxide film 2 is not limited to a silicon oxide film, and can be an oxide film or a nitride film that comprises atoms (second atom) that are different from the atoms that are adsorbed onto the semiconductor substrate 1 and that are selected from non-transition metals such as silicon, aluminum, beryllium, magnesium, calcium, strontium, barium, etc., and transition metals such as yttrium, lanthanum, cerium, titanium, zirconium, hafnium, tantalum, tungsten, etc. Further, these films can be formed using widely known methods, and their forming methods are not limited. For example, regarding the forming of oxide film 3, using a silicon source such as that described below, it can be done using the ALD method, which alternately repeats the adsorption of silicon atoms and oxidation, the CVD method, or the plasma CVD method, which supply a silicon source or a silicon source and an oxidant at the same time to the furnace. In order to prevent the degradation, etc., of the other films by heating, it is preferably carried out at a temperature range from room temperature to around 800° C. Additionally, formation of the oxide film 3 can be done with a noncontiguous process wherein the semiconductor substrate 1 to which atoms are adsorbed is exposed to air once, then oxidation or reaction is carried out in a different furnace, or with a contiguous process where it is not exposed to air and oxidation or reaction is carried out in the same furnace after depressurization, or it can be done with a contiguous process wherein the semiconductor substrate 1 is not exposed to air but oxidation or reaction is carried out in a different furnace.

Examples of a silicon source for the formation of the oxide film 3 include silane, disilane, or a silicon source that includes at least one of either a halogen group, ethoxy group, alkyl group, amino group, or a siloxane silicon source, etc. In detail, examples of silicon sources that include a halogen group are dichlorosilane (DCS), hexachlorodisilane (HCD), etc., those that include an ethoxy group are tetraethoxysilane (TEOS) etc., those that include an amino group are tris(dimethylamino)silane, bis-tertiary-butylaminosilane (BTBAS), di-isopropyl aminosilane, etc., and those including an alkyl group are tetramethysilane, etc.; examples of siloxane silicon sources include tetramethylcyclotetrasiloxane and octamethylcyclotetrasiloxane, etc. Further, as compounds that include both an amino group and an alkyl group, hexamethyldisilazane can be pointed out as well. The silicon sources listed above, unlike the silanol types, do not include an OH group. Therefore, by film formation using a silicon source, the generation of excess amount of dangling bonds in the oxide film 3 can be prevented, so a good quality oxide film 3 can be obtained. Furthermore, since the silicon sources are low cost, the cost of manufacturing the semiconductor device can be lowered.

Next, a post deposition nitriding process is carried out. The post deposition nitriding process is performed to nitride the oxidized layer 11 that is, in the manufacturing process up to this point, generated in the area near the surface of the semiconductor substrate 1 being oxidized. In detail, this oxidized layer 11 that is formed between the semiconductor substrate 1 and the oxide film 2 is a layer in which the surface of the semiconductor substrate 1 and part of its interior are oxidized, and for example, has a thickness of around 2 nm. Furthermore, the oxidized layer 11 comprises, along with oxygen atoms, atoms that are included in the semiconductor substrate 1 such as silicon atoms, etc., and atoms that are included in the oxide film 2 such as aluminum atoms, etc. This type of oxidized layer 11 is, for example, nitrided by annealing it under conditions that include a NH$_3$ atmosphere, 800° C., and 400 torr, forming a nitride layer 12. Therefore, the nitride layer 12 comprises, along with nitrogen atoms, atoms that are included in the semiconductor substrate 1 such as silicon atoms, etc., and atoms that are included in the oxide film 2 such as aluminum atoms, etc. Additionally, depending on the gas that is used during the post-nitriding process (for example NH$_3$), hydrogen atoms can be included therein. The nitriding gas is not limited to NH$_3$, and NOx gases such as NO, N$_2$O, etc., can be used as well. If the formed nitride layer 12 or other films include hydrogen, there is the fear that this hydrogen will degrade the nitride layer 12 or the other films, so it is more preferable to use a gas such as NOx, etc., that does not comprise hydrogen. Furthermore, this post-nitriding process is not limited to being carried out in succession after forming the oxide film 3 and, in the manufacturing steps for a semiconductor device, it is preferable to carry it out after last forming an oxide film or oxynitride film, and it can be carried out multiple times in the manufacturing steps of the semiconductor device.

Generally, among atoms that are included in each layer comprised by a multi-layered structure, those that are located in the interfaces, when compared to atoms that are located in the interior of each layer, have weaker bonding. Therefore, atoms that are present near the interfaces are easily affected from the outside and, in the present embodiment, when forming an oxide film, etc., on it, the surface of the semiconductor substrate 1 will also be oxidized, forming an oxide layer 11 on the surface of the semiconductor substrate 1 as well. Thus, the post-nitriding process is carried out so that an oxide layer 11 that is generated in this way is nitrided. Meanwhile, in the case of forming one or more films over the oxide layer 11 that is to be nitrided, since nitrogen has the characteristic of intruding into the interior of the film, it is possible to selectively nitride the oxide layer 11. The oxide film layer 11 generated in this way, compared to an oxide film generated directly, has a weaker atomic bonding in the film; additionally, as described earlier, atoms that are located on that interface have a weak bond. Therefore, by carrying out a post-nitriding process under the appropriate conditions, nitrogen will intrude into the interior, so an oxide layer 11 with a weak atomic bonding can be selectively nitrided.

Figure 1D:
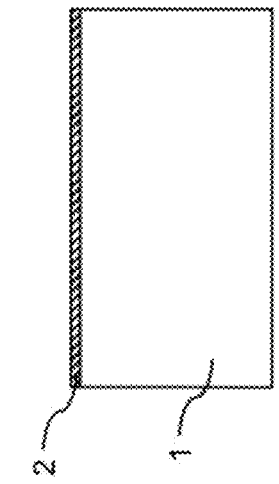

As can be seen from this description, according to the conditions of the post-nitriding process, as shown in FIG. 1D, the entire oxide layer 11 can be nitrided as well, or, though not shown in the diagrams, for the oxide layer 11, the parts near the interface with the semiconductor device 1 and the parts near the interface with the oxide film 2 can be nitrided, or for the oxide layer 11, only the part near the interface with the oxide layer 2 can be nitrided as well. In detail, in the case of using NOx in the post-nitriding process, for the oxide layer 11, the parts near the interface with the oxide film 2 can be nitrided, and in the case of using NH$_3$, for the oxide layer 11, the parts near the interface with the semiconductor device 1 and the parts near the interface with the oxide film 2 can be nitrided. However, in the present embodiment, for the oxide layer 11, at least the oxide film 2 side region needs to be nitrided.

Here, a detailed description will be omitted, but various films and elements can be formed on the oxide film 3 using widely known methods as well. Post-nitriding process is preferably carried out after forming an oxide film or a nitride film.

Figure 2A:
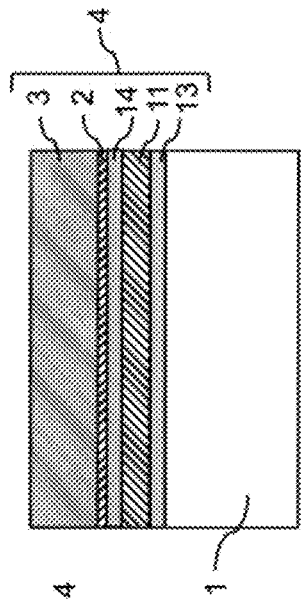
FIGS. 2A and 2B are diagrams of the semiconductor device according to the first embodiment.

In this way, in the present embodiment, as shown in FIG. 2A, an insulating film 4 can be obtained, wherein the insulating film 4 comprises an oxide film (a layer comprising the first oxygen/first layer) 2 and an oxide film (a layer comprising the second oxygen/second layer) 3 that are formed on the semiconductor device 1, and includes a nitride layer (a layer comprising nitrogen) 12 between the semiconductor substrate 1 and the oxide film 2. In detail, the oxide film 2 also comprises atoms (first atoms) selected from boron, non-transition metals, and transition metals at a concentration of greater than or equal to 1E12 atoms/cm$^2$ and less than or equal to 1E16 atoms/cm$^2$. Further, the oxide film 2 can be replaced with a nitride film, oxide-nitride film, boride film, sulfide film, carbide film, or oxide-carbide film, so long as the film replacing the oxide film 2 contains non-transition metals, and further, it is not limited to a film-like substance and can be in the form of atoms present on the surface of the semiconductor substrate 1. The oxide film 3 is an oxide film or an oxynitride film comprising atoms that are different from those that the oxide film 2 comprises and atoms (second atom) that are selected from silicon, non-transition metals, transition metals, and oxygen atoms. Furthermore, the film thickness of the nitride layer 12 is, for example, less than or equal to 2 nm.

Figure 2B:
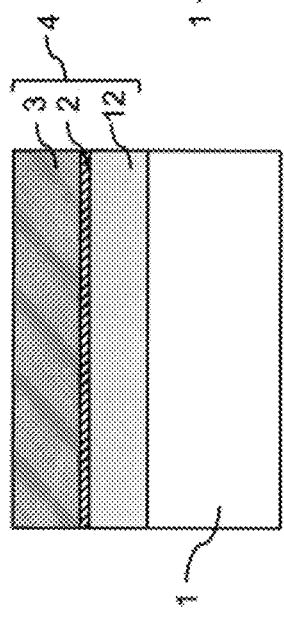

Additionally, as shown in FIG. 2B, by changing the conditions of the post-nitriding process, an insulating film 4, which is including an oxide film 2 and an oxide film 3, and which includes the lamination of a nitride layer 13, an oxide layer 11, and a nitride layer 14 between the semiconductor substrate 1 and the oxide film 2, can be obtained on the semiconductor substrate 1. In this case, too, the film thickness of each nitride layer 13 and 14 is, for example, less than or equal to 2 nm. In the present embodiment, it is not limited to the insulating film 4 shown in FIG. 2A and FIG. 2B, and it only needs to be an insulating film 4 that includes at least a nitride layer that touches the oxide film 2.

According to the present embodiment, by installing a nitride layer 12 between the semiconductor substrate 1 and the oxide film 2, in other words, by nitriding the oxide layer 11 that is in the interface, the characteristics of the insulating film 4 are improved and a semiconductor device 15 that has good device characteristics and reliability can be obtained. Below, it is described in detail.

Until now, the present inventors had obtained, as an insulating film 4, a film with good characteristics that suppresses leaks, etc., by forming a laminate film comprising an oxide film 2 and an oxide film 3 that becomes the parent material. The present inventors infer that, by making this kind of film, between adjacent heterogeneous oxide films (here, between the oxide film 2 and the oxide film 3), the transmigration of oxygen atoms occurs, with an electric dipole (dipole) being generated at the interface. Due to this, it is thought that the energy band is modulated, the barrier height (electronic barrier) of the oxide film 3 that is the parent material is controlled, and the characteristics of insulating film 4 are improved.

This will be described in further detail. Below, as one example, the oxide film 2 is an aluminum oxide film, and the oxide film 3 as the parent material is a silicon oxide film. When a silicon oxide film 3 is formed on the aluminum oxide film 2, because the oxygen concentration at the interface differs, oxygen atoms shift to the side where the oxygen concentration is low, so as to ameliorate the difference in the oxygen concentration at the interface. Specifically, with aluminum oxide film 2 and silicon oxide film 3, aluminum oxide film 2 has a higher oxygen concentration, so at the interface of aluminum oxide film 2 and silicon oxide film 3, the oxygen atoms in the aluminum oxide film 2 shift to the silicon oxide film 3 side. Further, when the aluminum oxide film 2 is thin, because the bonding within is weak, it is thought that oxygen atoms are prone to shift. In this way, when oxygen atoms shift, an electrical dipole is generated at the interface of differing oxide films, and will modulate the energy band structure at the interface between differing oxide films. Therefore, when an electrical dipole is generated so that a positive charge is placed on the oxide film, which becomes the injection side for the charge (electrons), and a negative charge is placed on the oxide film that is located on the opposite side from the injection side of the charge, because the energy band structure is modulated to the side that enlarges the barrier against the charge, in other words, is modulated such that the barrier height of the silicon oxide film 3 becomes higher, the tunneling rate of electrons decreases, and the leak can be suppressed. Also, even in the case of forming, instead of the oxide film 2, a nitride film, boride film, sulfide film, or a carbide film, because aluminum atoms are easily oxidized, its outermost surface will be oxidized. Therefore, even in the case of forming a film like the above, an electric dipole is generated and the energy band structure can be modulated.

When the oxide film 2 is a hafnium oxide film, and the oxide film 3 as the parent material is a silicon oxide film, the oxygen concentration is higher with silicon oxide film 3, so thus at the interface, the oxygen atoms in the silicon oxide film 3 shift to the hafnium oxide film 2 side and an electric dipole is generated and modulates the energy band structure at the interface. In this case, an electric dipole is generated that is reversed from the case wherein the oxide film 2 is an aluminum oxide film, and the energy band structure is modulated so that the barrier against the charge is reduced. Therefore, with this type of insulating film 4, the tunneling rate of the charge increases and a leak current is increased and, by extension, the stress applied to the insulating film 4 can be alleviated, so degradation can be avoided.

However, according to comparative example, when forming the aluminum oxide film 2 and the silicon oxide film 3 on the semiconductor substrate 1, the surface of the semiconductor substrate 1 is oxidized and an oxide layer 11 is generated. As a result, the insulating film 4 becomes a laminate structure of an oxide layer 11, aluminum oxide film 2, and a silicon oxide film 3. If a laminate film with such a structure is generated as the insulating film 4, an electric dipole that faces the direction opposite to the desired direction will be generated at the interface between the oxide layer 11 and the aluminum oxide film 2. In this case, the effects of the electric dipole between the aluminum oxide film 2 and the silicon oxide film 3 will be partially cancelled out. Therefore, a sufficient effect that could be obtained by the electric dipole between the aluminum oxide film 2 and the silicon oxide film 3 cannot be obtained so the energy band cannot be effectively controlled.

On the other hand, according to the present embodiment, after forming an aluminum oxide film 2 and a silicon oxide film 3, a post-nitriding process is conducted and the oxide layer is nitrided, and by forming a nitride layer 12, the generation of an electric dipole with a direction that is opposite to the desired direction is avoided, so sufficient effects resulting from the electric dipole between the aluminum oxide film 2 and the silicon oxide film 3 can be obtained. Therefore, the energy band can be effectively controlled and the barrier height of silicon oxide film 3 can be made high. Thus, the effect of controlling the leaks, etc., of the insulating film 4 is improved and a semiconductor device with good device characteristics and reliability can be obtained.

Figure 3:
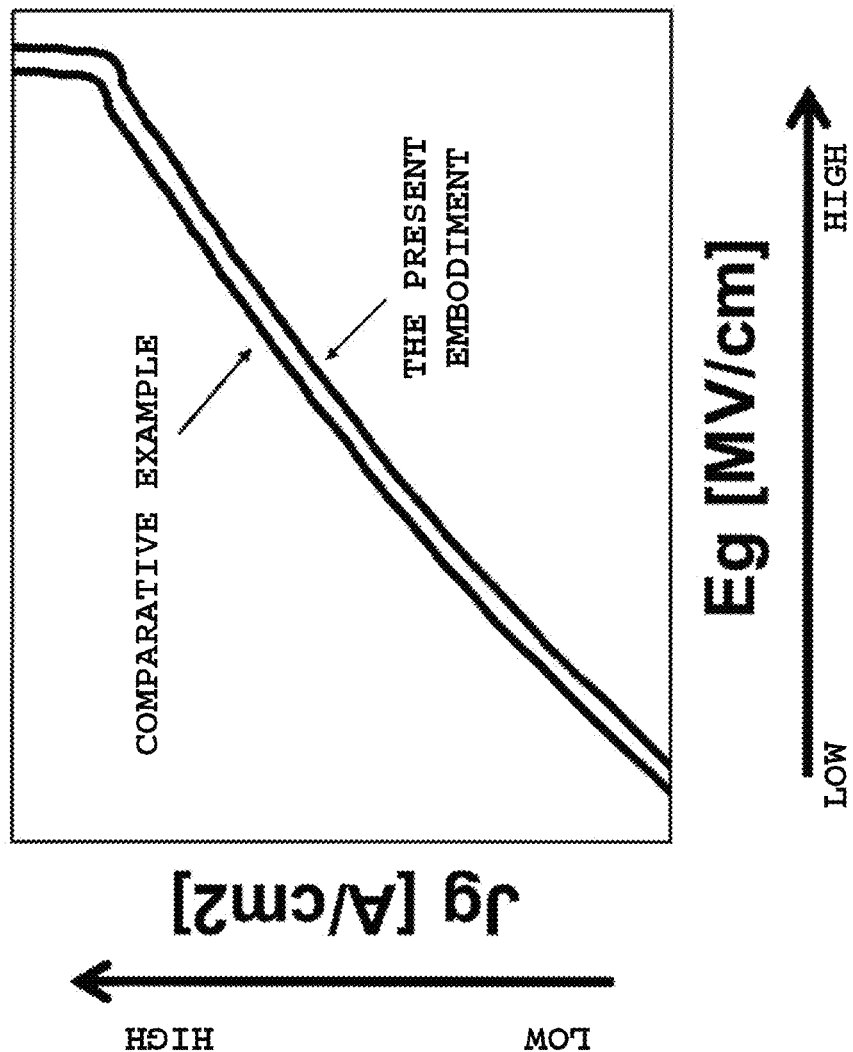
FIG. 3 is a diagram describing the first embodiment.

In order to confirm this effect, a sample (comparative sample) is formed, wherein the sample is a layered stack of an aluminum oxide film 2 and a silicon oxide film 3 which becomes the parent material formed on the semiconductor substrate 1 and is one in which an oxide layer 11 continues to be present on the surface of the semiconductor substrate 1, with another sample (the present embodiment) being formed, on which a post-nitriding process is carried out on the oxide layer 11 of the sample of the comparative sample and for which a nitride layer 12 is formed, then the manner in which the leak current characteristics changed is checked. Here, FIG. 3, which shows the relationship between the leak current concentration versus the applied field, is obtained. In detail, the sample is an MIS capacitor, and the production conditions of these samples are the same as for the manufacturing method used for the semiconductor device according to the present embodiment. The result obtained by injecting charge from the substrate side onto these samples is shown in FIG. 3. In this FIG. 3, the horizontal axis indicates the applied voltage density and the vertical axis indicates the leak current density. From this FIG. 3, it can be seen that, in the sample of the present embodiment, compared to the sample of the comparative sample, the leak current density is reduced across almost the entire electric field, and the effect of suppressing the leaking is improved.

That is, according to the present embodiment, by nitriding the oxide layer 11 that is at the interface, the barrier height improvement effect by the dipole that is generated at the interface of the aluminum oxide film 2 and the silicon oxide film 3, which becomes the parent material, is maximized, the characteristics of the insulating film 4 are improved, and a semiconductor device 15 with good device characteristics and reliability can be obtained.

Even when using a film wherein atoms such as aluminum, etc., or an oxide film, etc., that include it are installed in the interface of an insulating film that has multiple differing films, such as a silicon oxide film/silicon nitride film/silicon oxide film (ONO film) or silicon nitride film/silicon oxide film/silicon nitride film/silicon oxide film/silicon nitride film (NONON film) that are laminated, as the insulating film 4, the present embodiment can be applied.

Second Embodiment

Using FIGS. 4A and 4B and FIGS. 5A and 5B, the manufacturing method for the MONOS type nonvolatile semiconductor storage device 35 will be described with examples. However, the present disclosure is not limited to this, and can be applied to other semiconductor devices and their parts. In the description of the present embodiment, parts that have the same configuration and function as the first embodiment will be given the same code as the first embodiment, and their descriptions will be omitted. FIGS. 4A and 4B and FIGS. 5A and 5B correspond to a cross-sectional cut along the word line in the memory cell region of the semiconductor storage device 35.

First, as with the first embodiment, a semiconductor substrate 1 made from silicon is provided. This semiconductor substrate 1 is not limited to a silicon substrate, and needs only to be a base material that comprises silicon, such as a silicon germanium substrate, etc. Next, atoms (first atom) such as aluminum, etc., are adsorbed onto the semiconductor substrate 1. In the same way as the first embodiment, the atoms to be adsorbed are, besides aluminum, atoms selected from boron, non-transition metals, and transition metals. These atoms can also form one film that is either an oxide film, nitride film, boride film, sulfide film, or a carbide film. Meanwhile, the descriptions below will be provided as if they form an oxide film 2. Also, the adsorbed atoms are not limited to those that form a film-like substance, and the atoms need only to be present on the surface of the semiconductor substrate 1. Furthermore, the concentration of the atoms is preferably greater than or equal to $1E12$ atoms/$cm^2$ and less than or equal to 1E16 atoms/cm². The methods and conditions, etc., for the adsorption of atoms are the same as the first embodiment.

Next, on the oxide film 2, an oxide film 3, in this embodiment a silicon oxide film wherein the film thickness is between 2 nm and 5 nm, is formed using a thermal oxidation method. As with the first embodiment, the film that is formed on the oxide film 2 is not limited to a silicon oxide film, and needs only to be an oxide film or an oxynitride film that comprises atoms (second atom) wherein the atoms are different from those that are adsorbed on the semiconductor substrate 1, and are selected from silicon, non-transition metals, and transition metals. Further, these films can be formed using widely known methods that are also not limited, either.

As with the first embodiment, a post-nitriding process is carried out in order to nitride the oxide layer 11 that is inherently generated on the surface of the semiconductor substrate 1 being oxidized. In the manufacturing method for the semiconductor storage device of the present embodiment, in order to bring out the effects of the post-nitriding process, it is preferable to carryout the post-nitriding process before the charge accumulation layer 22 (FIG. 4B) comprising a silicon nitride film is formed on the oxide film 3. Further, a post-nitriding process can be carried out multiple times in this manufacturing method. In this way, a tunneling insulating film (first insulating film) 21 comprising a nitride layer (nitride film) 12, an oxide film 2, and an oxide film 3 can be formed on the semiconductor substrate 1. In the same way as the first embodiment, according to the conditions of the post-nitriding process, the entire oxide layer 11 (FIG. 1B) can be nitrided or, for the oxide layer 11, the portion thereof adjacent to the interface with the semiconductor substrate 1 and the portion adjacent to the interface with the oxide film 2 can be nitrided. However, in the present embodiment, for the oxide layer 11, at least the oxide film 2 side region (the part on the upper surface side of the oxide layer 11) needs to be nitrided.

Further, for example, a silicon nitride film with a film thickness of 2 nm to 20 nm is formed on the oxide film 3 as the charge accumulation film 22. Examples of the forming method include the use of the sub atmospheric or low pressure chemical vapor deposition method, a method wherein dichlorosilane and ammonia are reacted at a temperature less than or equal to around 800° C., may be used and in this manner, a structure like that shown in FIG. 4A is obtained.

Furthermore, a mask (not shown in the figure) is formed on the charge accumulation film 22 and, after going through well-known lithographic exposure steps and processing steps, an element isolating trench 25 is formed. In this way, a structure like that shown in FIG. 4B is obtained.

Next, the element isolating trench 25 is filled in with an element isolating insulating film 26 comprising a silicon oxide film, etc. Furthermore, for example, a silicon oxide film with a film thickness of 1 nm to 20 nm is formed as the block insulating film (second insulating film) 23 on the charge accumulation film 22 and as the element isolating insulating film 26. Examples of the forming method include the use of the sub atmospheric or low pressure chemical vapor deposition method, a method wherein dichlorosilane and nitrous oxide ($N_2O$) are reacted at around 800° C. to form the films 26 and 23.

A silicon film, with impurities added thereto or incorporated therein, is then formed on a block film 23 to form the control gate electrode. Examples of the forming method include the use of the sub atmospheric or low pressure chemical vapor deposition method, a method wherein silane and phosphine are introduced into a furnace under a temperature of around 500° C. to depose to n-doped silicon. In this way, a structure like that shown in FIG. 5A is obtained. An upper electrode 27 is then formed on the control gate electrode 24. For example, for the upper electrode 27, a silicon film to which impurities are added, i.e., doped polysilicon is formed, but the electrode material is not limited to that material, and metals such as TaN and W, etc., silicides such as CoSi and NiSi, etc., can be used as well. In this way, a semiconductor storage device 35 like that shown in FIG. 5B can be obtained.

Figure 6:
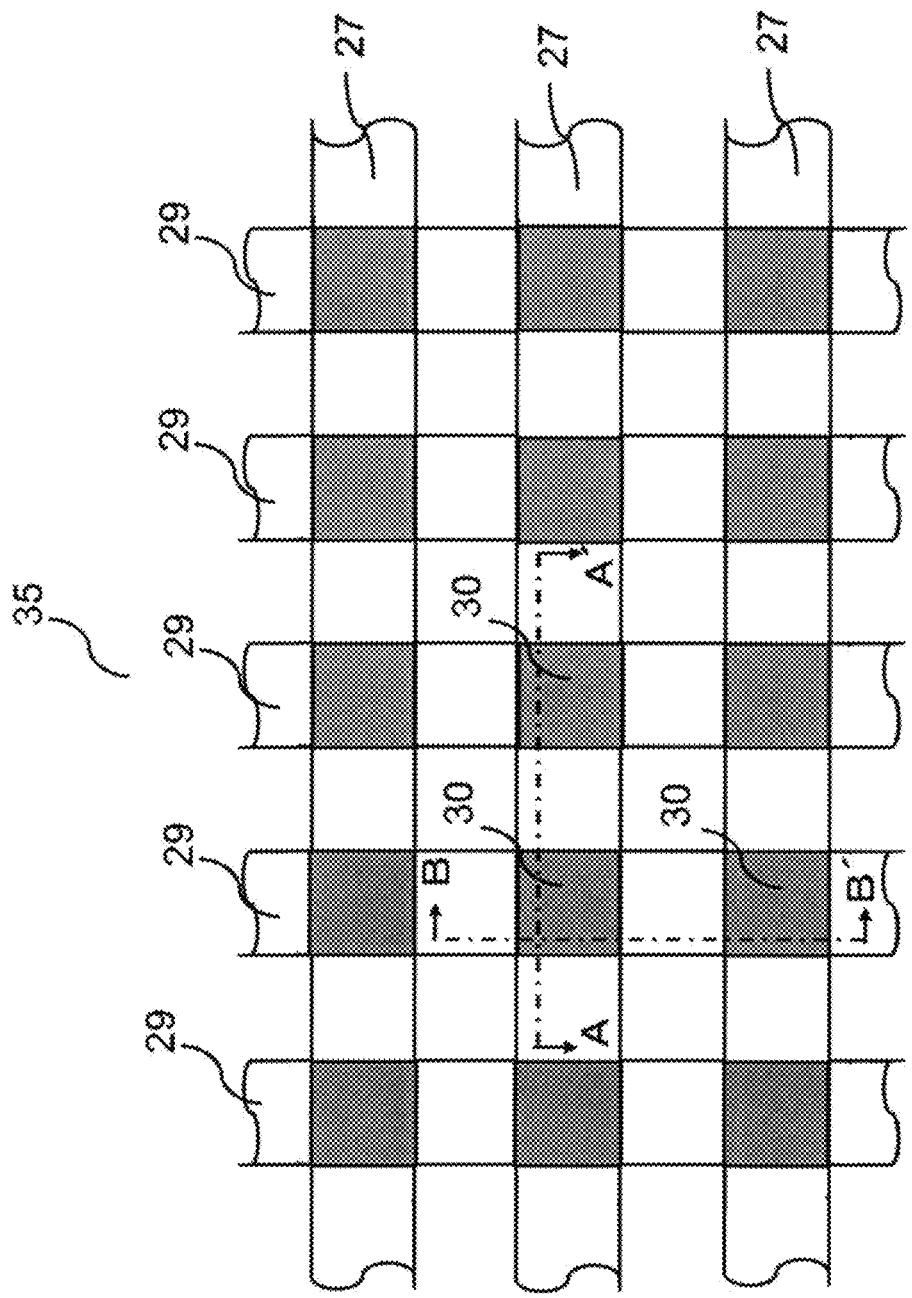
FIG. 6 is a plan-view diagram of the semiconductor storage device according to the second embodiment.
Figure 7A:
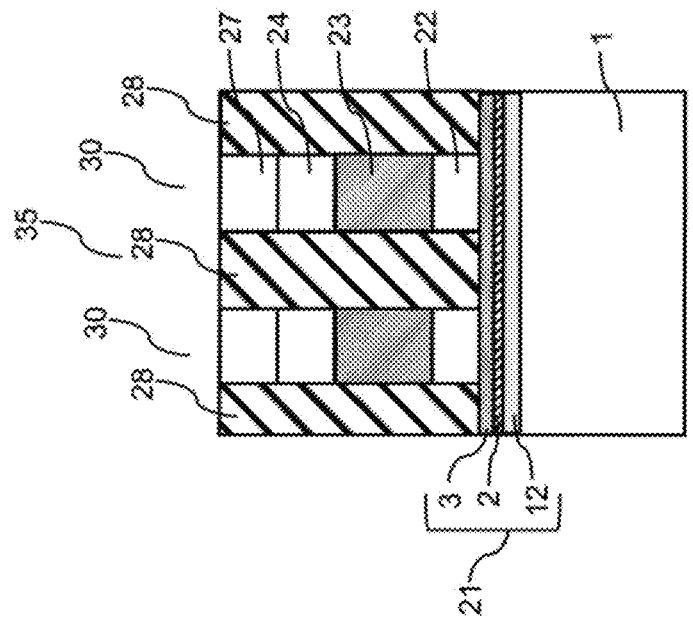
FIGS. 7A and 7B are cross-sectional diagrams of the semiconductor storage device according to the second embodiment.
Figure 7B:
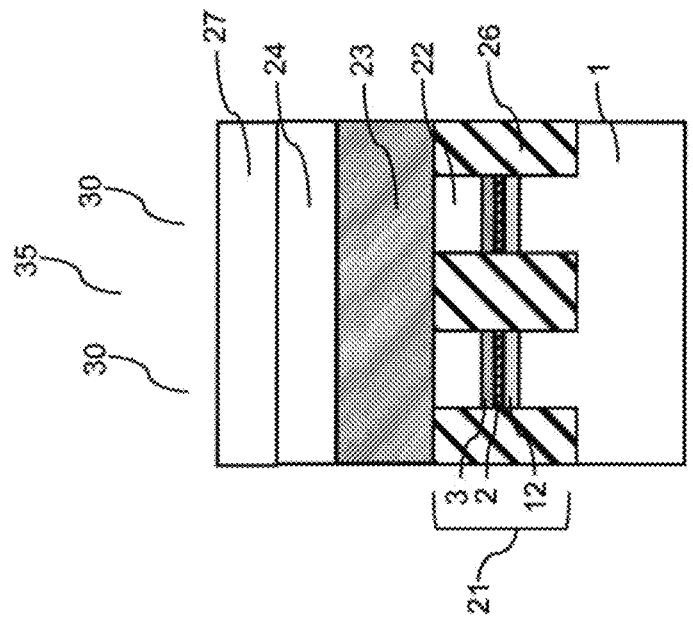

According to the present embodiment, a MONOS type nonvolatile semiconductor storage device 35 such as that shown in FIG. 6 and FIGS. 7A and 7B can be obtained. In detail, FIG. 6 shows the plan of a memory cell region of the semiconductor storage device 35 of the present embodiment, and FIG. 7A and FIG. 7B are cross-section of the memory cell region of the semiconductor storage device 35; in detail, FIG. 7A shows a cross-section of the semiconductor storage device 35 that is cut along A-A' in FIG. 6 and FIG. 7B is a cross-sectional diagram of the semiconductor storage device 35 that is cut along B-B' in FIG. 6.

As shown in FIG. 6, in the semiconductor storage device 35 of the present embodiment, multiple bit lines 29 are formed along the up/down direction of the paper. These multiple bit lines 29 are placed in the horizontal direction of the paper at equal set intervals and are parallel with each other. Multiple word lines (upper electrode) 27 are formed so that they are orthogonal with the multiple bit lines 29 when seen planarly. Furthermore, at the multiple parts where each bit line 29 and each word line 27 intersect three-dimensionally, multiple memory cell transistors 30 are formed. In other words, the multiple memory cell transistors 30 are placed in a matrix form in the memory cell region of the semiconductor storage device 35.

As shown in FIG. 7A, the device includes a semiconductor substrate 1 and multiple memory cell transistors 30 that are formed on the semiconductor substrate 1. Each memory cell transistor 30 is made of a multi-layer stack of a tunneling insulating film 21 and a charge accumulation film 22, and the transistors 30 are separated from each other by an element isolating trench 25 that is formed in the semiconductor substrate 1. Furthermore this element isolating trench 25 is filled in with an element isolating insulating film 26. On the charge accumulation film 22 and the element isolating insulating film 26, a block insulating film 23, a control gate electrode 24, and an upper electrode 27 are formed, extending to the left and right in FIG. 7A.

In detail, the tunnel insulating film 21 includes an oxide film 2 and an oxide film 3 formed on the semiconductor substrate 1, and furthermore, includes a nitride layer 12 extending between the semiconductor substrate 1 and the lowermost or adjacent oxide film 2. In this embodiment oxide film 2 also comprises atoms selected from boron, non-transition metals, or transition metals at a concentration of greater than or equal to 1E12 atoms/cm² and less than or equal to 1E16 atoms/cm². Further, the oxide film 2 can be replaced with a nitride film, oxide-nitride film, boride film, sulfide film, carbide film, or oxide-carbide film, so long as the film replacing the oxide film 2 contains non-transition metals; it is not limited to a film-like structure and it can be in the form of atoms present on the semiconductor substrate 1. The oxide film 3 is an oxide film or an oxynitride film comprising atoms that are different from the atoms that the oxide film 2 comprises and are atoms that are selected from silicon, non-transition metals, and transition metals. The film thickness of the nitride layer 12 is, for example, less than or equal to 2 nm.

Additionally, while not shown in the figure, in the same way as the first embodiment, the tunnel insulating film 21 of the present embodiment includes an oxide film 2 and an oxide film 3 that are formed on the semiconductor substrate 1, and further can have a multi-layer stack made of a nitride layer 13, an oxide layer 11, and a nitride layer 14, between the semiconductor substrate 1 and the oxide film 2. In this case, too, the film thickness of each nitride layer 13 and 14 is, for example less than or equal to 2 nm. The present embodiment is not limited to a tunnel insulating film 21 with such a structure, and only needs to be a tunnel insulating film 21 that at least includes a nitride layer that touches the oxide film 2.

Furthermore, as shown in FIG. 7B, the semiconductor storage device 35 of the present embodiment includes a semiconductor substrate 1 and multiple memory cell transistors 30 that are formed on the semiconductor substrate 1. Here, while descriptions that overlap with the descriptions in FIG. 7A are omitted, adjacent memory cell transistors 30 are separated by interlayer dielectric film 28.

That is, according to the present embodiment, by installing a nitride layer 12 between the semiconductor substrate 1 and the oxide film 2, characteristics of the tunnel insulating film 4, such as leak suppression, etc., are improved, and a semiconductor storage device 35 with good device characteristics and reliability can be obtained.

Modified Example 1 of Second Embodiment

In the descriptions so far, cases in which the present embodiment is applied to the tunnel insulating film 21 of the MONOS type nonvolatile semiconductor storage device 35 have been discussed, but it is not limited to these and, for example, it can be applied to a block insulating film 23, as shown in FIG. 8A. Further, as shown in FIG. 8B, it can be applied to the tunnel insulating film 21 and the block insulating film 23. FIG. 8A and FIG. 8B correspond to the cross-sectional diagram of FIG. 7A.

Modified Example 2 of Second Embodiment

Furthermore, as shown in FIGS. 9A and 9B, it can be applied to an floating gate type nonvolatile semiconductor storage device 45. In detail, this floating gate type nonvolatile semiconductor storage device 45 is one wherein the charge accumulation film 22 of the MONOS type nonvolatile semiconductor storage device 35 of the second embodiment is replaced with an floating gate electrode 42 comprising a conductive body film, with the block insulating film 23 being replaced by an interelectrode insulating film 43, and the present embodiment is applied to the tunnel insulating film 21 and/or the interelectrode insulating film 43. FIG. 9A corresponds to FIG. 7A and FIG. 9B corresponds to FIG. 7B, and shows the semiconductor storage device 45 when applied to the tunnel insulating film 21.

Modified Example 3 of Second Embodiment

Figure 10A:
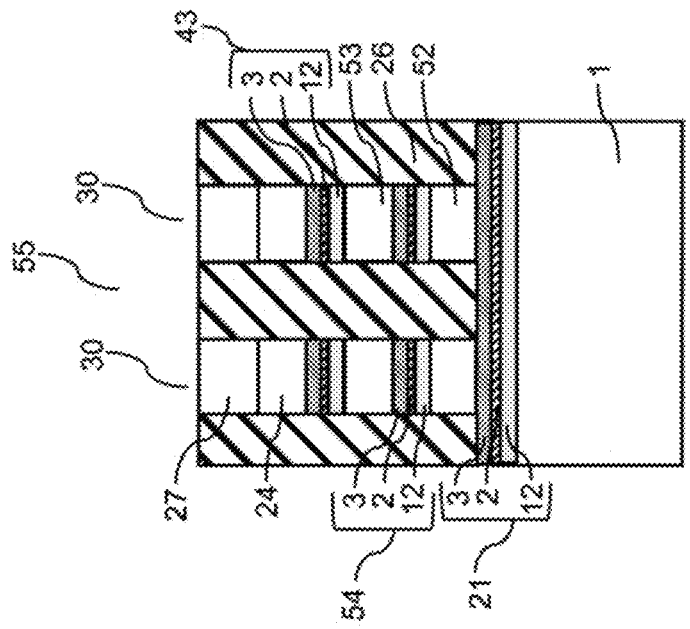
FIGS. 10A and 10B are cross-sectional diagrams (third) of an alternative example of the semiconductor storage device according to the second embodiment.
Figure 10B:
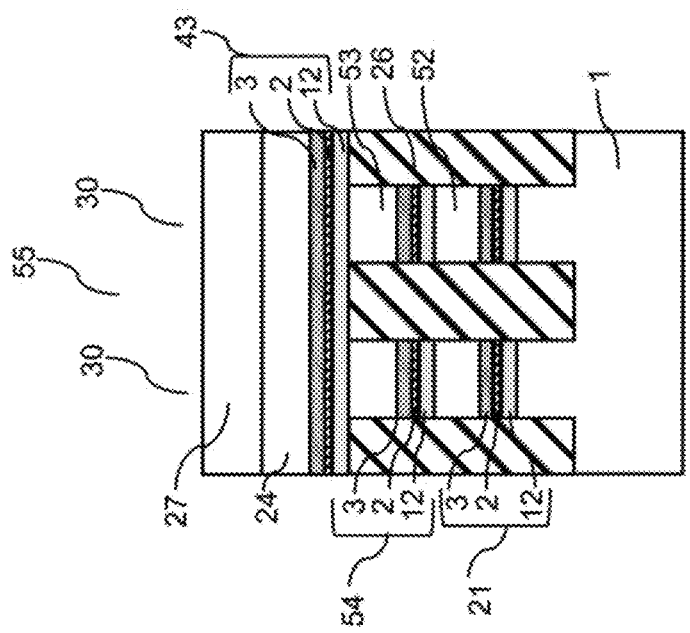

Further, as shown in FIGS. 10A and 10B, it can also be applied to a double floating gate type nonvolatile semiconductor storage device 55. In detail, in the semiconductor storage device 55, the floating gate electrode is divided into two—the lower floating gate electrode 52 and the upper floating gate electrode 53—and between them an inter-floating gate electrode film 54 is inserted. The present embodiment can be applied to at least one of either the tunnel insulating film 21, inter-floating gate insulating film 54, and interelectrode insulating film 43. FIG. 10A corresponds to FIG. 7A and FIG. 10B corresponds to FIG. 7B, and shows the semiconductor storage device 55 when applied to the tunnel insulating film 21, inter-floating gate insulating film 54, and the interelectrode insulating film 43.

Furthermore, while not shown in the figure, the present embodiment can be applied to an insulating film included in a semiconductor storage device that has a three-dimensional structure such as a BiCS (Bit-Cost-Scalable) structure, etc.

In these modified examples, too, by applying the present embodiment, the characteristics of the tunnel insulating film, such as leak suppression, etc., are improved, and a semiconductor storage device with good device characteristics and reliability can be obtained.

While certain embodiments have been described, these embodiments have been presented by way of example only, and are not intended to limit the scope of the invention. Indeed, the novel embodiments described herein may be embodied in a variety of other forms; furthermore, various omissions, substitutions and changes in the form of the embodiments described herein may be made without departing from the spirit of the invention. The accompanying claims and their equivalents are intended to cover such forms or modifications as would fall within the scope and spirit of the invention.

What is claimed is:

1. A semiconductor storage element in a memory array, comprising:
   a semiconductor base material;
   a tunnel insulating layer formed on the base material;
   a charge accumulation layer formed on the tunnel insulating layer; wherein
   the tunnel insulating layer formed between the charge accumulation layer and the base material, the tunnel insulating layer comprising a nitride layer adjacent the base material, an oxide film comprising a first conductor compound layer including a first conductor compound overlying the nitride layer and a second conductor compound layer including a second conductor compound overlying the first conductor compound layer, wherein the second conductor compound comprises an oxygen concentration that is different from an oxygen concentration of the first conductor compound.

2. The semiconductor storage element of claim 1, wherein the first conductor compound layer is a metal oxide.

3. The semiconductor storage element of claim 2, wherein the metal oxide comprises an aluminum oxide layer.

4. The semiconductor storage element of claim 3, further including an insulating layer formed over the charge accumulation layer, and a control gate film formed over the insulation layer.

5. The semiconductor storage element of claim 3, wherein a concentration of aluminum atoms in the aluminum oxide layer is 1E12 atoms/cm$^2$ to 1E16 atoms/cm$^2$.

6. The semiconductor storage element of claim 1, wherein the nitride layer is a nitrided oxide layer.

7. A semiconductor storage element for a memory array, comprising:
   a semiconductor substrate;
   a charge accumulation layer formed on the semiconductor substrate; and
   a tunnel insulating layer formed between the charge accumulation layer and the semiconductor substrate, wherein the tunnel insulating layer comprises:
   a nitride layer adjacent the semiconductor substrate; and
   an oxide film comprising a first conductor layer including a first conductor compound overlying the nitride layer and a second conductor layer including a second conductor compound overlying the first conductor layer, wherein:

the second conductor compound comprises an oxygen concentration that is different from an oxygen concentration of the first conductor compound, and the second conductor compound comprises atomic specie that are different from atomic specie of the first conductor compound.

8. The semiconductor storage element of claim 7, wherein the first conductor layer comprises a metal oxide.

9. The semiconductor storage element of claim 8, wherein the metal oxide comprises an aluminum oxide layer.

10. The semiconductor storage element of claim 9, further including an insulating layer formed over the charge accumulation layer.

11. The semiconductor storage element of claim 10, further including a control gate film formed over the insulation layer.

12. The semiconductor storage element of claim 9, wherein a concentration of aluminum atoms in the aluminum oxide layer is 1E12 atoms/cm$^2$ to 1E16 atoms/cm$^2$.

* * * * *